United States Patent
Tan et al.

[11] Patent Number: 5,795,451
[45] Date of Patent: Aug. 18, 1998

[54] SPUTTERING APPARATUS WITH A ROTATING MAGNET ARRAY

[75] Inventors: Swie-In Tan, San Jose, Calif.; David Ian Charles Pearson, Hampshire, United Kingdom

[73] Assignees: Read-Rite Corporation, Milpitas, Calif.; Nordiko, Ltd., United Kingdom; one half interest

[21] Appl. No.: 874,075

[22] Filed: Jun. 12, 1997

[51] Int. Cl.$^6$ ............................................. C23C 14/35
[52] U.S. Cl. ............................ 204/298.2; 204/298.19; 204/298.16
[58] Field of Search ................... 204/298.16, 298.17, 204/298.18, 298.19, 298.2, 298.22, 192.12

[56] References Cited

U.S. PATENT DOCUMENTS

| | | | |
|---|---|---|---|
| 5,047,130 | 9/1991 | Akao et al. | 204/192.12 |
| 5,182,003 | 1/1993 | Maass et al. | 204/298.23 |
| 5,374,343 | 12/1994 | Sasaki et al. | 204/192.12 |
| 5,496,455 | 3/1996 | Dill et al. | 204/298.2 |

FOREIGN PATENT DOCUMENTS

| | | | |
|---|---|---|---|
| 62-8964 | 4/1987 | Japan | 204/298.2 |
| 63-109163 | 5/1988 | Japan | 204/298.2 |

*Primary Examiner*—M. Nuzzolillo
*Assistant Examiner*—Rodney G. McDonald
*Attorney, Agent, or Firm*—Nathan N. Kallman

[57] ABSTRACT

A sputtering apparatus includes a rotatable array plate and a magnetic array including a group of permanent magnets arranged around the plate periphery in one or more quadrants. Each magnet is perpendicular to the plate, having a pole of a first polarity facing toward the target. A bar permanent magnet is affixed to the plate within the same quadrant of a group of magnets and is located between a center axis of rotation and the magnet group. The bar permanent magnet is perpendicular to the plate, having a pole of a second polarity facing toward the target. The magnets create a closed-loop static magnetic field that is substantially triangular in shape, concentrated in the quadrant, and offset from the center axis of rotation. The magnets in one quadrant may be replicated to fill up to four quadrants, and additional bar magnets are arranged to create a rotating magnetic field at the target that patterns the plasma to a maximum plasma density in the shape of a kidney. Each arrangement creates an axi-symmetric target erosion profile for optimizing deposition uniformity at the substrate, when rotated behind the sputtering target.

6 Claims, 2 Drawing Sheets

SPUTTERING APPARATUS WITH A ROTATING MAGNET ARRAY

BACKGROUND OF THE INVENTION

1. Field of the Invention

The invention relates to sputtering apparatus and in particular to an RF (radio frequency) diode or DC (direct current) magnetron sputtering apparatus using a rotatable magnet array.

2. Background Art

In semiconductor device fabrication, a large number of integrated circuit devices are formed on a thin, circular semiconductor substrate called a wafer. A process of physical vapor deposition by sputtering is used to provide metallization layers and interconnects between device layers fabricated on the wafer. Deposition of layers on the wafer may be performed by direct current (DC) magnetron sputtering or radio frequency (RF) diode sputtering. A wafer is set in a vacuum chamber anode opposite a target (cathode). A sputtering gas is introduced into the vacuum chamber. When a negative electrical bias or an RF (radio frequency) potential is supplied to the target a glow discharge occurs and a high-density plasma, i.e. an electrically neutral, highly-ionized gas, for sputtering is confined near the target. Atoms of the target are sputtered when ions in the plasma collide with the target. The sputtered atoms are transferred from the target to the wafer and adhere to the surface of the wafer, forming a thin film by sputter deposition.

A magnetic force having field lines which loop through the sputter target surface may be used to restrict the paths of the electrons in the plasma, thereby intensifying and confining the plasma and making possible DC (direct current) operation.

Wafer sizes have continually increased, and now the use of 8 inch diameter wafers is common. Larger wafer sizes permit a larger number of integrated circuit devices to be grown on a single wafer thus increasing device throughput. However, larger wafer sizes make it more difficult for the sputtering apparatus to deposit layers of uniform thickness over an entire wafer surface.

The prior art describes a sputtering device to which is added a mechanically rotated circular permanent magnet assembly. The rotation of the permanent magnet assembly causes a more uniform erosion of the target surface. The rotating magnet is mounted behind the target and sweeps the plasma over the face of the target. Rotation of the plasma is for improving uniformity of film coverage, as well as for improving the target utilization. While a significant improvement over sources employing stationary magnets can be obtained, a very uniform sputtered film is not generally realized.

Good film thickness uniformity is achieved by making the target large with respect to the wafer size. Furthermore the target to wafer distance is generally made as small as possible. For magnetic film deposition, a magnetic orienting field is required to obtain the desired magnetic properties of the deposited thin film. Such a magnetic field causes distortion of the plasma, leading to a non-uniform film thickness distribution across the wafer, and causing operational problems.

It is therefore desirable to provide a method and apparatus for obtaining good deposited film uniformity in RF diode sputtering systems.

It is also desirable to provide an apparatus that is capable of achieving high deposited film uniformity with relatively small targets and in the presence of a deposition magnetic field such as is required for deposition of magnetic materials.

It is also desirable to provide a method and apparatus for obtaining very high deposited film uniformity in DC magnetron sputtering systems.

SUMMARY OF THE INVENTION

According to this invention, a sputtering apparatus includes a rotatable array plate wherein a thin film of material is sputtered onto a substrate at small negative potential relative to an anode from a sputtering target cathode. A magnetic array is provided that includes a group of permanent magnets uniformly arranged around a periphery of the array plate in one or more quadrants thereof. Each magnetic axis in the group of permanent magnets is perpendicular to the plate, having a pole of a first polarity facing toward the target. A bar permanent magnet is affixed to the plate within the same quadrant as the group of permanent magnets and located between a center axis of rotation and the group of permanent magnets. The bar permanent magnetic axis is perpendicular to the plate, having a pole of a second polarity facing toward the target. The magnets create a closed-loop dipole magnetic field that is somewhat triangular in shape, concentrated in the one quadrant, and offset from the center axis of rotation.

In accordance with another aspect of the invention, the magnets in one quadrant are replicated to fill up to four quadrants and additional bar magnets are arranged to create a rotating magnetic field at the target that patterns the plasma to a maximum plasma density in the shape of a kidney. The plasma wraps around the center of rotation of the magnetic array such that at the center of rotation plasma density is at a minimum.

In accordance with an aspect of the invention, the magnetic force field is of a magnitude sufficiently weak and discontinuous to prevent inducing a magnetron effect on the target.

The invention has the advantage of excellent thickness uniformity of a film deposited by RF diode sputtering and in the presence or absence of an orienting magnetic field using a target size that is much smaller than is commonly practiced.

The invention has the advantage of excellent thickness uniformity of a film deposited by DC magnetron sputtering.

BRIEF DESCRIPTION OF THE DRAWINGS

FIG. 5 is a diagram of a high intensity plasma pattern achieved by the rotating magnetic array of FIG. 4; and.

DESCRIPTION OF THE PREFERRED EMBODIMENTS

Figure 1:
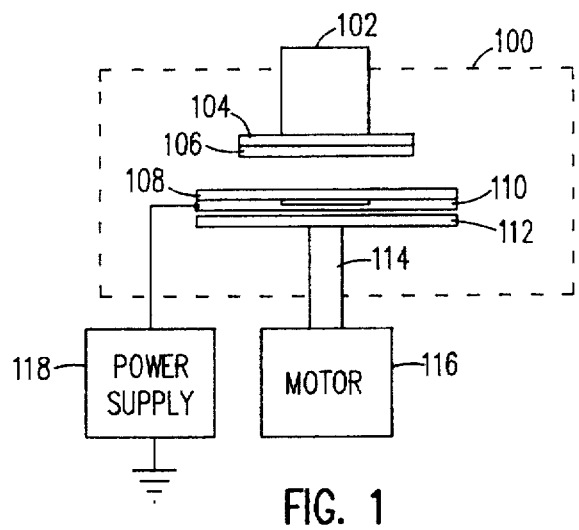
FIG. 1 is a cross-sectional diagram of a sputtering apparatus in which the invention is embodied.

Refer to FIG. 1 which is a cross-sectional diagram of a sputtering apparatus in which the invention is embodied. A sputtering device, either RF diode sputtering or DC magnetron sputtering, has a low pressure inert gas chamber (100). Within the chamber is a support (102) with a table (104) for holding an object such as a semiconductor wafer (106) having a surface to be coated. A target (108) within the chamber provides a source of coating material. The target (108) is held to a rear plate (110) and together they form the cathode of the system.

A circular magnetic array plate (112) is positioned behind the target surface and comprises a plurality of permanent magnets. The magnetic array plate (112) is connected to a drive shaft (114) driven by a motor (116) to cause movement of the plate with respect to the target such that the lines of magnetic flux created by the magnets on the plate sweep the surface of the target. The coating material of the target is transferred from the target (108) to the wafer (106) such that the motion of the magnetic source depletes the target in a manner to coat the wafer uniformly.

A sputtering gas is introduced into the vacuum chamber (100) by means which are not shown but are well known. Electrical power is supplied to the target (108) by power supply (118) which is connected to the cathode rear plate (110). A glow discharge occurs and a high-density plasma for sputtering is enclosed and confined near the target by a magnetic field created by the rotating magnetic source (112). Atoms of the target (108) are sputtered when ions in the plasma collide with the target. The sputtered atoms adhere to the surface of the wafer (106), which is an anode electrode of the system, forming a thin film by deposition.

A magnetic force generated by the magnetic source (112) having field lines which loop through the sputter target surface (108) confines the electrons in the plasma, thereby intensifying and confining the plasma.

In sputtering systems good film thickness uniformity is achieved by making the target (108) large with respect to the wafer (106). The target to wafer distance is made as small as possible. For magnetic film deposition on the wafer (106), a static magnetic orienting field is introduced to obtain desired magnetic properties in the thin film that is deposited.

RF Diode Sputtering System

Figure 2:
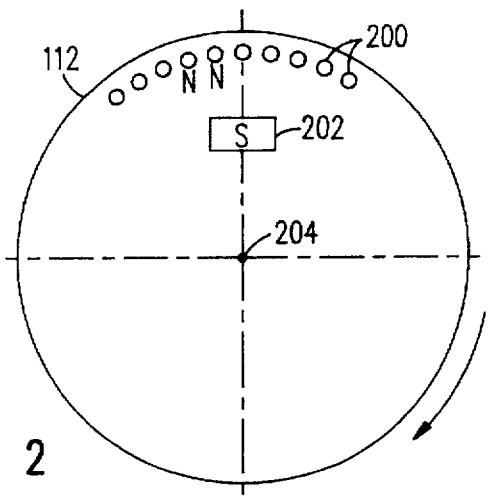
FIG. 2 is diagram of a single magnet set of a rotating magnetic array in an RF diode sputtering system in accordance with the invention.

Refer to FIG. 2 which is diagram of a single magnet set of a rotating magnetic array plate (112) in an RF diode sputtering system in accordance with the invention. The magnetic array is comprised of a number of small round permanent magnets (200) uniformly arranged around the periphery of the array plate in one quadrant thereof. A bar permanent magnet (202) is affixed to the plate (112) within the same quadrant as the round permanent magnets (200) and located between the center axis of rotation (204) and the round magnets (200). Each round magnet is perpendicular to the plate surface and has its north pole facing upward toward the target (108) of FIG. 1. The bar permanent magnet (202) is perpendicular to the plate surface and has its south pole facing upward toward the target (108) of FIG. 1. This arrangement of magnets creates a closed-loop static magnetic force field that is somewhat triangular in shape, concentrated in one quadrant, and offset from the axis (204). As magnetic array plate (112) rotates about the center axis of rotation (204) the magnetic field patterns the plasma density in the RF diode sputtering system. The rotating magnetic field is created behind the target and creates a uniform deposition profile across the anode as the magnetic field sweeps over the target (108). The strengths of the magnets on the plate (112) are chosen such that the magnetic field created by the magnets is of a magnitude sufficiently weak and discontinuous such that the field does not induce a magnetron effect.

Figure 3:
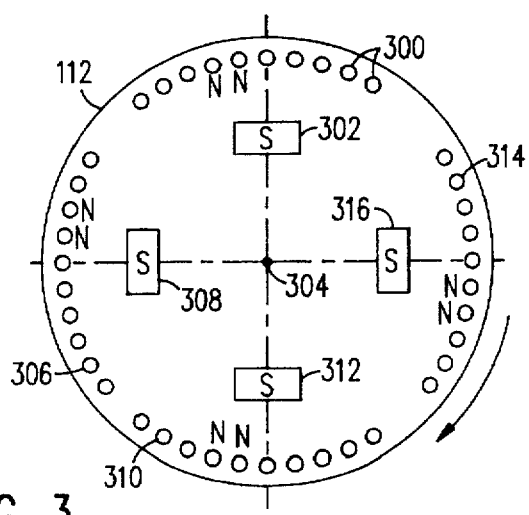
FIG. 3 is diagram of a four magnet set of a rotating magnetic array in an RF diode sputtering system in accordance with the invention.

Refer to FIG. 3 which is diagram of a four magnet set of a rotating magnetic array in an RF diode sputtering system in accordance with the invention. In FIG. 3 magnet sets of one quadrant as shown in FIG. 2 are replicated in four quadrants. It will be understood that the magnet sets of one quadrant as shown in FIG. 2 can be replicated in two, three or four quadrants.

The magnetic array is comprised of a number groups of small round permanent magnets (300, 306, 310, 314) uniformly arranged around the periphery of the array plate in each of four quadrants thereof. Bar permanent magnets (302, 308, 312,316) are affixed to the plate (112) within the respective quadrants, each located between the center axis of rotation (204) and each of the round permanent magnet groups. Each round magnet is perpendicular to the plate surface and has its north pole facing upward toward the target (108) of FIG. 1. The bar permanent magnets are perpendicular to the plate surface and have their south poles facing upward toward the target (108) of FIG. 1. This arrangement of magnets creates four magnetic force fields that are somewhat triangular in shape, concentrated in each quadrant, and offset from the axis (304). As magnetic array plate (112) rotates about the center axis of rotation (204) the magnetic field patterns the plasma density in the RF diode sputtering system. The rotating magnetic field is created behind the target and creates a uniform deposition profile across the anode as the magnetic field sweeps over the target (108). The strengths of the magnets on the plate (112) are chosen such that the magnetic field created by the magnets is sufficiently weak and discontinuous so that the field does not induce a magnetron effect.

In practice, in an RF sputtering system, film thickness uniformity of less than 4% at 3 sigma over a 6 inch×6 inch square wafer or 8.5 inch diameter wafer has been achieved using 13 inch diameter targets. This result has been achieved both with and without a magnetic deposition field being applied during RF diode sputtering deposition.

DC Magnetron Sputtering

Figure 4:
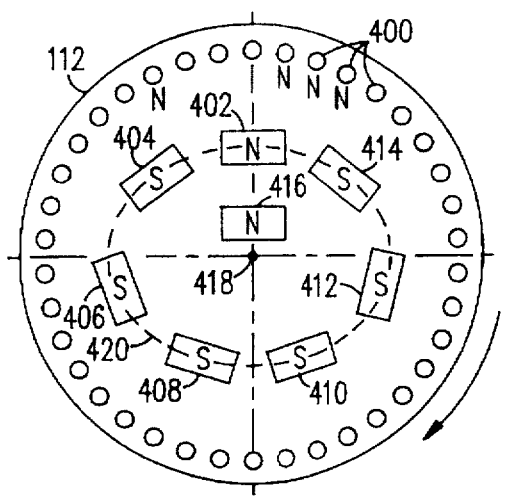
FIG. 4 is diagram of a rotating magnetic array in an DC magnetron sputtering system in accordance with the invention.

Refer to FIG. 4 which is diagram of a rotating magnetic array in an DC magnetron sputtering system in accordance with the invention. The magnetic array is comprised of a number groups of small round permanent magnets (400) uniformly arranged around the periphery of a circular plate (112). Bar permanent magnets (402, 404, 406, 408, 410, 412, 414) are affixed to the plate (112) uniformly arranged around an inner, non-concentric oval of the array. The inner oval is represented by a broken line (420). The inner oval is located between the center axis of rotation (418) and the round permanent magnets. Each round magnet is perpendicular to the plate surface and has its north pole facing upward toward the target (108) of FIG. 1. Each bar permanent magnet is perpendicular to the plate surface. All except one bar magnet (402) have their south poles facing upward toward the target (108) of FIG. 1. The bar magnet (402) has its north pole facing upward toward the target (108). An additional bar magnet (416) is located in the vicinity of the bar magnet (402) and also has its north pole facing upward toward the target (108).

Figure 5:
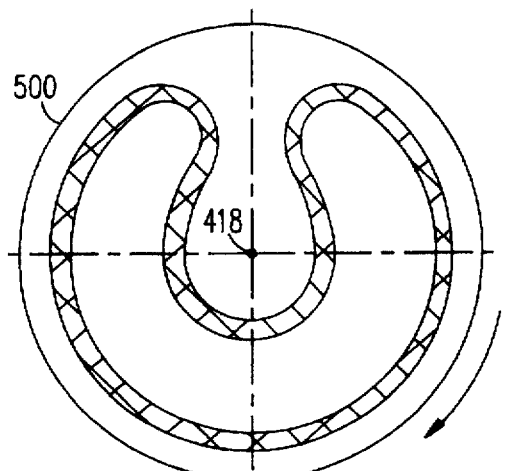

This arrangement of magnets creates a static magnetic field (500) whose surface parallel component is kidney shaped, around the axis (418). As magnetic array plate (112) rotates about the center axis of rotation (418) the magnetic field patterns the plasma density in the magnetron sputtering system. The rotating magnetic field is created behind the target which provides the patterning of the plasma density in the kidney shape shown in FIG. 5.

In a magnetron sputtering system, film thickness uniformity of less than 3%, at 3 sigma is obtained for 6 inch×6 inch wafers or 8.5 inch diameter wafers. This invention is applicable to any rotating circular magnetron.

Figure 6:
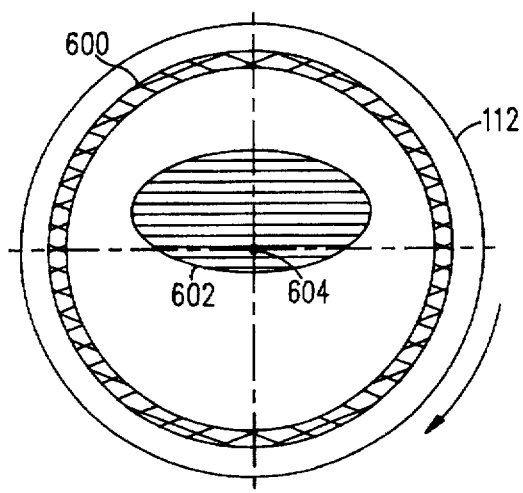
FIG. 6 is a diagram of a high intensity plasma pattern achieved by a prior art rotating magnetic array.

FIG. 6 is a diagram of a high intensity plasma pattern achieved by a prior art rotating magnetic array. The plasma density is concentrated in a ring (600) around the periphery of the array and an oval (602) that is concentrated at the center of rotation (604) and offset therefrom.

While the invention has been particularly shown and described with reference to preferred embodiments thereof, it will be understood by those skilled in the art that the foregoing and other changes in form and detail may be made therein without departing from the scope of the invention.

What is claimed is:

1. A sputtering apparatus wherein a film of material is sputtered onto a wafer at an anode from a sputtering target cathode facing said anode comprising a rotatable array plate having a center axis of rotation and spaced from said target cathode, said target cathode being located between said rotatable array plate and said anode;

a magnetic array comprising a group of permanent magnets disposed on said rotatable array plate and uniformly arranged around a periphery of said array plate in one quadrant thereof;

each magnet in said group of permanent magnets being perpendicular to said plate and having a pole of a first polarity facing toward said target;

a single bar permanent magnet affixed to said plate within the same quadrant as said group of permanent magnets and located between said center axis of rotation and said group of permanent magnets;

said bar permanent magnet being perpendicular to said plate and having a pole of a second polarity facing toward said target;

said group of permanent magnets and said bar permanent magnet creating a closed-loop static magnetic field that is substantially triangular in shape, concentrated in said one quadrant, and offset from said center axis of rotation.

2. The sputtering apparatus in accordance with claim 1 wherein said magnetic field is of a magnitude sufficiently weak and discontinuous for preventing induction of a magnetron effect on said target.

3. A sputtering apparatus comprising:

a vacuum chamber;

a target within said chamber from which target material is sputtered; and a rotatable circular plate having an axis of rotation and positioned behind said target;

said plate having permanent magnets located around a periphery of said plate in one quadrant and a bar permanent magnet positioned between said axis of rotation and said permanent magnets in said one quadrant for providing a magnetic field;

said permanent magnets and said bar permanent magnet being perpendicular to said plate and of opposing polarity.

4. The sputtering apparatus in accordance with claim 3 wherein said magnetic field is of a magnitude sufficiently weak and discontinuous for preventing induction of a magnetron effect on said target.

5. A sputtering apparatus wherein a film of material is sputtered onto a wafer at an anode from a sputtering target cathode comprising:

a rotatable array plate;

a magnetic array comprising groups of permanent magnets, said permanent magnets being uniformly arranged within each group at a periphery of said array plate in each of four quadrants thereof;

each magnet in a group being perpendicular to said array plate and having a pole of a first polarity facing toward said target cathode; and a single bar permanent magnet affixed to said array plate within each quadrant, each located between a center axis of rotation and each of said permanent magnet groups;

said bar permanent magnets being perpendicular to said plate surface and having poles of a second polarity facing toward said target;

said groups of permanent magnets and said bar permanent magnets creating magnetic fields that are substantially triangular in shape, concentrated in each quadrant, and offset from said center axis.

6. The sputtering apparatus in accordance with claim 5 wherein said magnetic fields are of a magnitude sufficiently weak and discontinuous for preventing induction of a magnetron effect on said target.

* * * * *